(12) United States Patent
Sawahata

(10) Patent No.: US 8,513,737 B2
(45) Date of Patent: Aug. 20, 2013

(54) ESD PROTECTION ELEMENT

(75) Inventor: Kouichi Sawahata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 395 days.

(21) Appl. No.: 12/825,909

(22) Filed: Jun. 29, 2010

(65) Prior Publication Data
US 2011/0006341 A1     Jan. 13, 2011

(30) Foreign Application Priority Data
Jul. 7, 2009    (JP) .................................. 2009-160722

(51) Int. Cl.
*H01L 23/62* (2006.01)

(52) U.S. Cl.
USPC ............ 257/355; 257/173; 257/575; 257/577

(58) Field of Classification Search
USPC ................. 257/143, 175, 511, 517, 525, 526, 257/539, 542, 557, 552, 555, 556, 575, 173, 257/355, 360–362
See application file for complete search history.

(56) References Cited

U.S. PATENT DOCUMENTS

| | | | |
|---|---|---|---|
| 5,850,095 A | 12/1998 | Chen et al. | |
| 6,429,490 B2 * | 8/2002 | Sawahata | 257/356 |
| 6,713,818 B2 * | 3/2004 | Kodama | 257/362 |
| 7,456,440 B2 * | 11/2008 | Morishita | 257/173 |
| 7,582,938 B2 * | 9/2009 | Chen | 257/357 |
| 7,948,036 B2 * | 5/2011 | Chen | 257/357 |
| 7,973,334 B2 * | 7/2011 | Verleye et al. | 257/173 |
| 7,986,502 B2 * | 7/2011 | Sorgeloos | 361/56 |
| 8,030,683 B2 * | 10/2011 | Sawahata | 257/173 |
| 2001/0002717 A1 * | 6/2001 | Sawahata | 257/356 |
| 2003/0218841 A1 * | 11/2003 | Kodama | 361/56 |
| 2008/0002321 A1 * | 1/2008 | Sorgeloos et al. | 361/57 |
| 2009/0045436 A1 * | 2/2009 | Verleye et al. | 257/173 |
| 2009/0244797 A1 * | 10/2009 | Sawahata | 361/56 |
| 2009/0294856 A1 * | 12/2009 | Chen | 257/357 |
| 2010/0008002 A1 * | 1/2010 | Sorgeloos | 361/56 |
| 2010/0230719 A1 * | 9/2010 | Sawahata | 257/173 |
| 2011/0006341 A1 * | 1/2011 | Sawahata | 257/143 |

FOREIGN PATENT DOCUMENTS

JP    2011018685 A  *  1/2011

OTHER PUBLICATIONS

Mergens et al., "ESD Protection Considerations in Advanced High-Voltage Technologies for Automotive", ESO/ESD Symposium 2006, p. 54.
Ming-Dou, The Impact of Low-Holding-Voltage Issue in High-Voltage CMOS Technology and the Design of Latchup-Free Power-Rail ESD Clamp Circuit for LSD Driver ICs, IEEE Journal of Solid-State Circuits, vol. 40, No. 8, p. 1751, Aug. 2005.

\* cited by examiner

*Primary Examiner* — David Vu
*Assistant Examiner* — Earl Taylor
(74) *Attorney, Agent, or Firm* — Young & Thompson

(57) ABSTRACT

An electrostatic discharge (ESD) protection element using an NPN bipolar transistor, includes: a trigger element connected at one end with a pad. The NPN bipolar transistor includes: a first base diffusion layer; a collector diffusion layer connected with the pad; a trigger tap formed on the first base diffusion layer and connected with the other end of the trigger element through a first wiring; and an emitter diffusion layer and a second base diffusion layer formed on the first base diffusion layer and connected in common to a power supply through a second wiring which is different from the first wiring.

17 Claims, 13 Drawing Sheets

ESD PROTECTION ELEMENT

INCORPORATION BY REFERENCE

This patent application claims a priority on convention based on Japanese Patent Application No. 2009-160722 filed on Jul. 7, 2009. The disclosure thereof is incorporated herein by reference.

TECHNICAL FIELD

The present invention relates to an electrostatic discharge (ESD) protection element for protecting an internal circuit from ESD, and more particularly, to an ESD protection element using an NPN bipolar transistor.

BACKGROUND ART

In recent years, improvement of reliability is required for semiconductor integrated circuits (ICs) used in various fields. For an IC used for a product such as a liquid crystal river circuit for a car-mounted navigation or medical use, particularly high reliability is required. To achieve such high reliability of a product, endurance to external overvoltage (electrostatic discharge) should be increased. That is, an IC having high ESD endurance is required.

In order to increase the ESD endurance of an LSI (Large Scale Integrated circuit), a protection element against ESD (ESD protection element) is provided between an internal circuit and an outside (input/output pad) of the LSI chip. The ESD protection element changes a path of surge current generated due to the electrostatic discharge (ESD) to prevent the internal circuit of the LSI from being broken.

In general, as the ESD protection element, a MOSFET (Metal-Oxide-Semiconductor Field-Effect Transistor), an NPN bipolar transistor, or a thyristor is used. For example, the ESD protection element using the NPN bipolar transistor has been described in "ESD Protection Considerations In Advanced High-Voltage Technologies for Automotive" (non-patent literature 1), or IEEE Journal of Solid-State Circuits (Vol. 40, No. 8, P. 1751, August 2005 (non-patent literature 2)).

In the ESD protection element using an NPN bipolar transistor, a base voltage of the NPN bipolar transistor is pulled up by a high voltage due to ESD, to activate a bipolar transistor, and surge current flows through the NPN bipolar transistor. This can prevent the surge current from flowing into an internal circuit connected to a pad. Typically, junction breakdown generated due to the increase in the base voltage triggers the activation of the bipolar operation. However, if the junction breakdown locally occurs at a local point, current is concentrated on the local point, and therefore a variation occurs in current density of the surge current in a base width direction (W direction) to reduce the ESD endurance.

For this reason, the triggering of the bipolar operation is performed not by the breakdown of the NPN bipolar transistor itself but by an externally arranged trigger element, and as the result of this, the above-described degradation in the ESD endurance can be improved. For example, U.S. Pat. No. 5,850,095 (patent literature 1) describes an ESD protection element based on an NPN bipolar transistor provided with a trigger element.

FIG. 1 is a diagram illustrating a cross-sectional structure of the ESD protection element described in the patent literature 1. FIG. 2 is a circuit diagram illustrating an equivalent circuit of the ESD protection element described in the patent literature 1.

Referring to FIGS. 1 and 2, a structure and operation of the ESD protection element in the patent literature 1 will be described. Referring to FIG. 1, in the ESD protection element in the patent literature 1, a P-type substrate 101 (P-sub), and an N-type buried layer 102 (NBL) are formed in a Z-axis direction from a lower layer, and an N-type well 103 is formed on the N-type buried layer. A P-type well 104 is formed on the N-type well 103 to function as a base region. A heavily doped P-type diffusion layer (hereinafter to be referred to as a $P^+$ base diffusion layer) 105 is formed in the P-type well 104, to function as a base terminal B10, and heavily doped N-type diffusion layers (hereinafter to be referred to as $N^+$ emitter diffusion layers) 106 are formed in the P-type well 104, to function as an emitter terminal E10. Also, a heavily doped N-type diffusion layer (hereinafter to be referred to as an $N^+$ collector diffusion layer) 107 is formed on the N-type buried layer 102, to function as a collector terminal C10.

The $P^+$ base diffusion layer 105 is connected to a pad 100 through a trigger element (diode 200), and also grounded through a resistive element 300 (R10). The $N^+$ emitter diffusion layer 106 is grounded. The $N^+$ collector diffusion layer 107 is connected to the pad 100. The pad 100 is connected to an internal circuit (not shown). The trigger element is the diode 200, and an anode of the diode 200 is connected to the $P^+$ base diffusion layer 105 and a cathode thereof is connected to the pad 100 and the $N^+$ collector diffusion layer 107. Based on such a structure, the ESD protection element according to a conventional technique is represented by the equivalent circuit illustrated in FIG. 2.

Referring to FIG. 2, if a voltage applied to the pad 100 due to ESD exceeds a breakdown voltage of the diode 200, a current flows from the base terminal B10 toward GND. At this time, the resistance element 300 provided between the base terminal B10 and the GND causes a voltage at the base terminal B10 (base voltage) to increase, and surge current due to the ESD starts to flow between the collector terminal C10 and the emitter terminal E10. That is, the bipolar operation is started in response to triggering by the trigger element, and the surge current can be prevented from flowing into the internal circuit.

CITATION LIST

[patent literature 1]: U.S. Pat. No. 5,850,095
[non-patent literature 1]: "ESD Protection Considerations In Advanced High-Voltage Technologies for Automotive" (EOS/ESD Symposium 2006, P. 54)
[non-patent literature 2]: IEEE Journal of Solid-State Circuits, Vol. 40, No. 8, P. 1751, August 2005

SUMMARY OF THE INVENTION

Referring to FIG. 1, noise endurance of the ESD protection element will be described. Between the collector ($N^+$ diffusion layer) 107 and the base (P-type well) 104, there exists a parasitic junction capacitance (Ccb). Therefore, the base voltage is delayed as compared with an emitter voltage by a time determined by R10×Ccb. At this time, the base voltage is instantaneously brought to a higher voltage than the emitter voltage, and PN diodes formed between the P-type well (base region) 104 and the $N^-$ emitter diffusion layers 106 are made conductive. That is, even with small noise, the ESD protection element operates to flow the surge current between the pad and GND. The ESD protection element in the patent literature 1 uses the external resistance element 300 in order to pull up the base voltage. The noise endurance of the ESD protection element is reduced due to the resistance element 300.

In an aspect of the present invention, an electrostatic discharge (ESD) protection element using an NPN bipolar transistor, includes: a trigger element connected at one end with a pad. The NPN bipolar transistor includes: a first base diffusion layer; a collector diffusion layer connected with the pad; a trigger tap formed on the first base diffusion layer and connected with the other end of the trigger element through a first wiring; and an emitter diffusion layer and a second base diffusion layer formed on the first base diffusion layer and connected in common to a power supply through a second wiring which is different from the first wiring.

In another aspect of the present invention, an electrostatic discharge (ESD) protection element comprising first and second NPN bipolar transistors whose collectors are connected to each other, and a trigger element. The first NPN bipolar transistor includes: a first base diffusion layer; a first trigger tap formed on the first base diffusion layer and connected with one end of the trigger element through a first wiring; and a first emitter diffusion layer and a second base diffusion layer formed on the first base diffusion layer and connected in common to the pad through a second wiring which is different from the first wiring. The second NPN bipolar transistor includes: a third base diffusion layer; a second trigger tap formed on the third base diffusion layer and connected with the other end of the trigger element through a third wiring; and a second emitter diffusion layer and a fourth base diffusion layer formed on the third base diffusion layer and connected in common to a power supply through a fourth wiring which is different from the third wiring.

According to the ESD protection element according to the present invention, not only ESD endurance but also the noise endurance can be improved.

Also, the number of elements of the ESD protection element and a wiring amount can be reduced.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Hereinafter, an electrostatic discharge (ESD) protection element according to the present invention will be described with reference to the attached drawings. In the present embodiment, the ESD protection element using an NPN bipolar transistor for protecting an internal circuit (not shown) from ESD breakdown will be described.

[First Embodiment]

Figure 1:
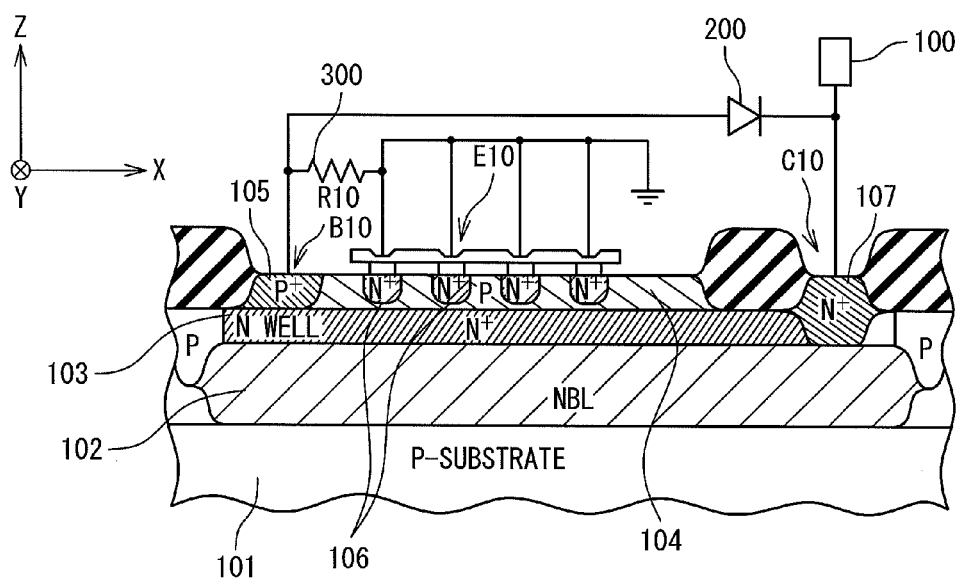
FIG. 1 is a cross-sectional view illustrating a structure of a conventional ESD protection element.
Figure 2:
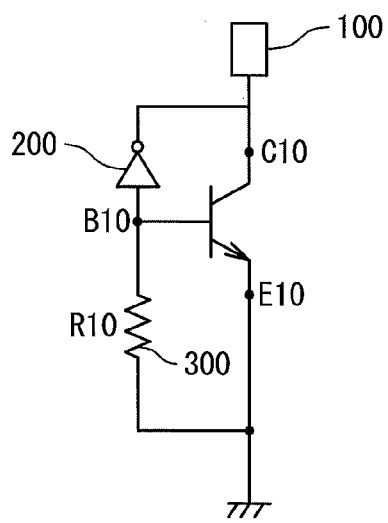
FIG. 2 is a diagram illustrating an equivalent circuit of the conventional ESD protection element.
Figure 3:
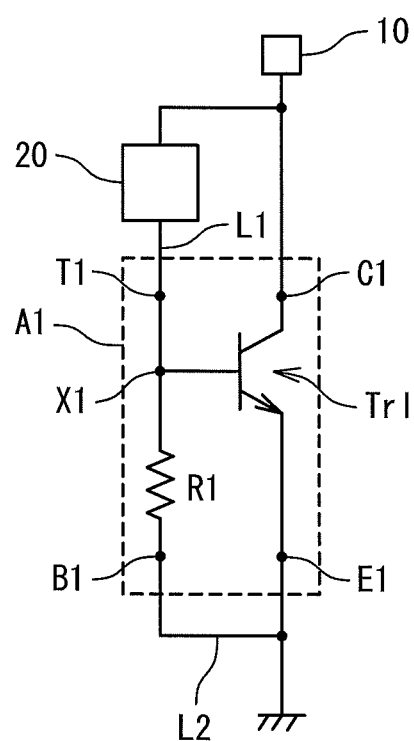
FIG. 3 is a diagram illustrating an example of an equivalent circuit of an ESD protection element according to a first embodiment of the present invention.
Figure 4:
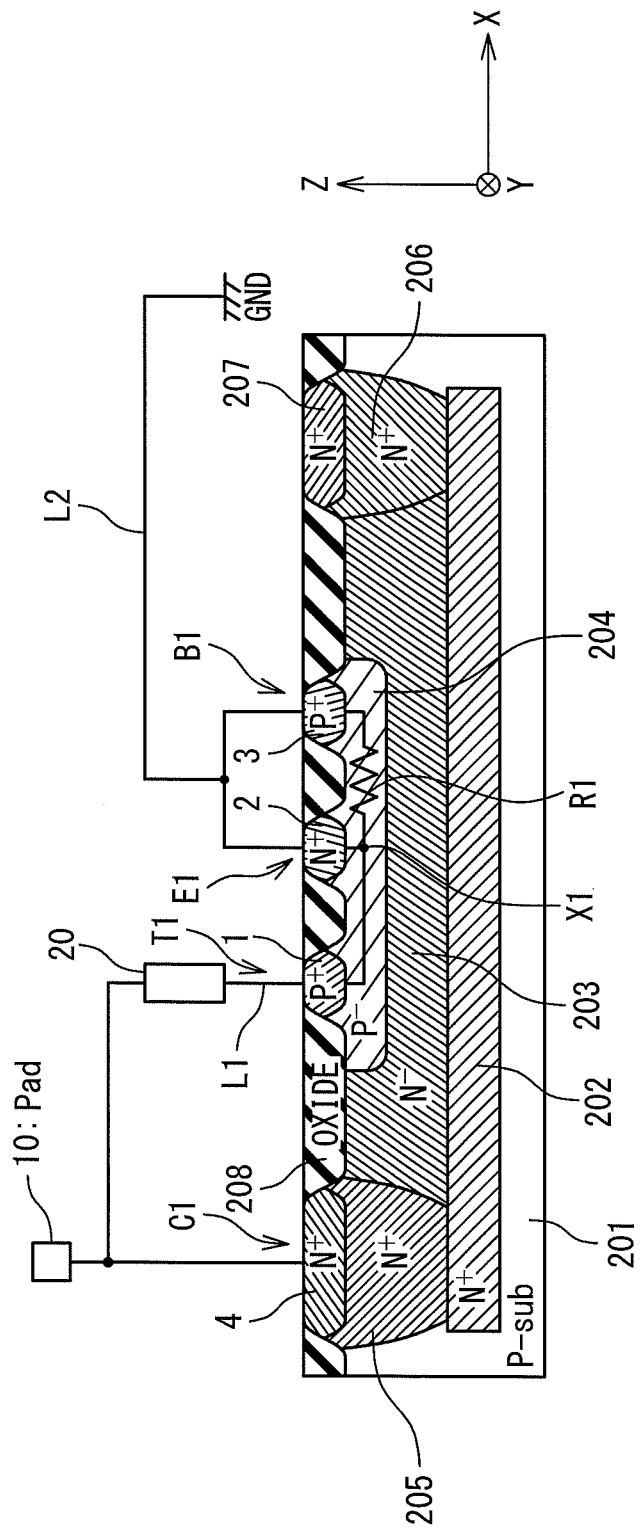
FIG. 4 is a cross-sectional view illustrating an example of a structure of the ESD protection element according to the first embodiment of the present invention.
Figure 5:
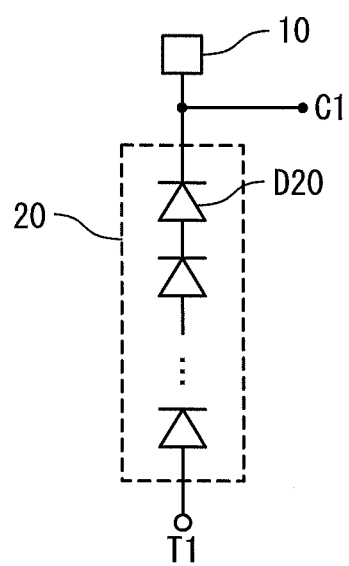
FIG. 5 is a circuit diagram illustrating an example of a configuration of a trigger element in the first embodiment.
Figure 6:
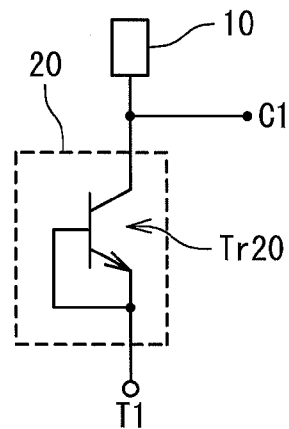
FIG. 6 is a circuit diagram illustrating another example of the configuration of the trigger element in the first embodiment.

Referring to FIGS. 3 to 6, a configuration and operation of the ESD protection element according to a first embodiment of the present invention will be described. FIG. 3 is a diagram illustrating an equivalent circuit in the ESD protection element according to the first embodiment of the present invention. FIG. 4 is a cross-sectional view illustrating a structure of the ESD protection element according to the first embodiment of the present invention.

Referring to FIG. 3, the ESD protection element in the first embodiment is provided with an NPN bipolar transistor Tr1, a trigger element 20, and a resistance R1 formed by a base diffusion layer of the NPN bipolar transistor Tr1. A collector terminal C1 of the NPN bipolar transistor Tr1 is connected to a pad 10, a base region X1 is connected to the trigger element 20 and the resistance R1, and an emitter terminal E1 is connected to a power source (GND). The base region X1 and one terminal of the trigger element 20 are connected to each other through a trigger tap T1 and a wiring line L1. The other terminal of the trigger element 20 is connected to the pad 10 and the collector terminal C1. The resistance R1 is formed between the base region X1 and the base terminal B1, and connected to the power source (GND in this case) through the base terminal B1 and a wiring line L2.

A region A1 surrounded by a dashed line in FIG. 3 represents a region that is formed in a lower layer below a wiring layer, in a region for the NPN bipolar transistor Tr1. Referring to FIG. 4, configurations of the NPN bipolar transistor Tr1 and resistance R1 formed in the region A1 will be described in detail.

Referring to FIG. 4, in the ESD protection element in the first embodiment, a heavily doped N-type diffusion layer ($N^+$ diffusion layer) 202 is formed on a P-type substrate (P-sub) 201, and heavily doped N-type diffusion layers ($N^+$ diffusion layers) 205 and 206 are formed on the $N^+$ diffusion layer 202. A lightly doped N-type diffusion layer ($N^+$ diffusion layer) 203 is formed on the $N^+$ diffusion layer 202 between the $N^+$ diffusion layers 205 and 206. A lightly doped P-type diffusion layer (hereinafter to be referred to as a $P^-$ base diffusion layer) 204 is formed to function as the base region.

A heavily doped P-type diffusion layer (hereinafter to be referred to as a trigger tap diffusion layer) 1, a heavily doped N-type diffusion layer (hereinafter to be referred to as an $N^+$ emitter diffusion layer) 2, and a heavily doped P-type diffusion layer (hereinafter to be referred to as a $P^+$ base diffusion layer) 3 are formed on the $P^-$ base diffusion layer 204. The trigger tap diffusion layer 1 is connected to the one terminal of the trigger element 20 through the wiring line L1, to function as the trigger tap T1 that electrically connects the trigger element 20 and the $P^-$ base diffusion layer 204. The $N^+$ emitter diffusion layer 2 is connected to the power supply line (ground (GND) in this case) through the wiring line L2 different from the wiring line L1, to function as the emitter terminal E1. The $P^+$ base diffusion layer 3 is also connected to the power supply line (GND in this case) through the wiring line L2, to function as the base terminal B1. The wiring lines L1 and L2 are different wiring lines that are electrically isolated from each other in a wiring layer. Also, a heavily doped N-type diffusion layer (hereinafter to be referred to as an $N^+$ collector diffusion layer) 4 is formed on the $N^+$ diffusion layer 205, and is connected to the pad 10 and the other terminal of the trigger element 20, and functions as the collector terminal C1. Further, a heavily doped N-type diffusion layer 207 is provided on the $N^+$ collector diffusion layer 206. Any adjacent two of the $N^+$ collector diffusion layer 4, the trigger tap diffusion layer 1, the $N^+$ emitter diffusion layer 2, the $P^+$ base diffusion layer 3, and the heavily doped N-type diffusion layer 207 are isolated from each other by an element isolation region 208 (e.g., an oxide insulating film).

The $N^+$ emitter diffusion layer 2 is preferably formed between the trigger tap diffusion layer 1 and the $P^+$ base diffusion layer 3 in an X-axis direction. It should be noted that in the $P^-$ base diffusion layer 204, a region just below the $N^+$ emitter diffusion layer 2 is supposed to be the base region X1. When the $N^+$ emitter diffusion layer 2 is provided between the trigger tap diffusion layer 1 and the $P^-$ base diffusion layer 3, a trigger current flows between the base region X1 and the base terminal B1 from the trigger tap T1 to the power supply line (GND). In the $P^-$ base diffusion layer 204, a region between the base terminal B1 and the base region X1 functions as the resistance R1, and pulls up a voltage (base voltage) of the base region X1 with the trigger current.

As the trigger element 20, a diode or a transistor (MOS transistor or bipolar transistor) can be preferably used, like a conventional technique. For example, referring to FIG. 5, a circuit element in which an arbitrary number of diodes D20 are connected in series can be used as the trigger element 20. In this case, an anode of the diode D20 is connected to the trigger tap T1, and a cathode is connected to the pad 10 and collector terminal C1. If a voltage equal to or more than a summation of breakdown voltages of the diodes D20 is applied to the pad 10, the trigger current flows to the power supply line (GND) through the base region X1 and the resistance R1. Alternatively, referring to FIG. 6, a transistor Tr20 can be used as the trigger element 20. For example, in the case of using an NPN bipolar transistor, a base and an emitter are connected to the trigger tap T1, and a collector is connected to the pad 10 and the collector terminal C1. If a voltage having a predetermined value or more is applied from the pad 10, the transistor Tr20 is broken down, so that the trigger current flows to the power supply line (GND) through the base region X1 and resistance R1.

Next, the operation of the ESD protection element in the first embodiment will be described in detail.

If a positive ESD voltage equal to or more than the predetermined voltage is applied to the pad 10, the trigger element 20 (e.g., of the diodes D20) connected between the pad 10 and the trigger tap T1 is broken down. This causes the trigger current to flow from the trigger tap T1 to the power supply line (GND) through the base region X1. The trigger current causes a voltage drop due to the resistance R1 to pull up a voltage (base voltage) of the base region X1.

The increase in the base voltage brings a voltage of PN junction between the emitter terminal E1 and the base region X1 into a forward bias state, and therefore an electron current starts to flow from the emitter terminal E1 to the base region X1. The electron current reaches the collector terminal C1 through diffusion to form a collector current. At this time, a depletion layer having a strong electric field is formed between the collector terminal C1 and the base region X1 (between the $N^-$ diffusion layer 203 and the $P^-$ base diffusion layer 204). In this region, the flowing electron current cause impact ionization to generate a base current. The base current induces forward biasing between the emitter terminal E1 and the base region X1, and the NPN bipolar transistor Tr1 is set to an ON state to start a snap back operation. Thus, the surge current (ESD current) due to ESD starts to flow from the pad 10 to the power supply line (GND) through the collector terminal C1 and the emitter terminal E1. When the current starts to flow through the NPN bipolar transistor Tr1, the base voltage decreases and reaches a constant voltage, and therefore the trigger current through the trigger element 20 stops flowing.

As described above, if a high voltage due to ESD is applied to the pad, the ESD protection element in the present embodiment starts the bipolar operation because of the breakdown of the trigger element 20, and the surge current flows from the pad 10 toward the power supply line (GND). This allows the internal circuit to be protected from the ESD.

According to the ESD protection element according to the present invention, the trigger element functions as a trigger for the bipolar operation in the same manner as in the conventional case. For this reason, a reduction in ESD endurance due to a variation in current density in the base width direction (Y-axis direction) can be avoided.

Also, in the present invention, on the $P^-$ base diffusion layer 204 serving as the base region, the base terminal B1 connected to the power supply line (GND), and the trigger tap T1 connected to the trigger element 20 are separately provided. The trigger current flows from the trigger tap T1 into the $P^-$ base diffusion layer 204 and then flows to the power supply GND through the base terminal B1. At this time, the emitter terminal E1 (under which the base region X1 is present) is formed between the trigger tap T1 and the base terminal B1, and thereby the $P^-$ base diffusion layer 204 between the base region X1 and the base terminal B1 functions as the resistance R1 for pulling up the base voltage. For this reason, by setting a distance between the base region X1 and the base terminal B1, and an impurity concentration of the $P^-$ base diffusion layer 204 to an appropriate value, a magnitude of the resistance R1 can be arbitrarily set. That is, the resistance R1 determined by taking into account noise endurance can be realized by the base diffusion layer.

The $P^-$ base diffusion layer 204 is connected through the base terminal B1 to the power supply line (GND) common to the emitter terminal ($N^+$ emitter diffusion layer) 2, and the resistance value of the resistance R1 can be set smaller than that of a conventional external resistor. For this reason, a voltage difference between the emitter terminal E1 and the base region X1 can be set smaller than that in the conventional case to improve the noise endurance of the ESD protection element. Also, in the present invention, an external resistor is not used, and therefore the number of elements used for the ESD protection element and a wiring amount can be reduced.

Figure 7:
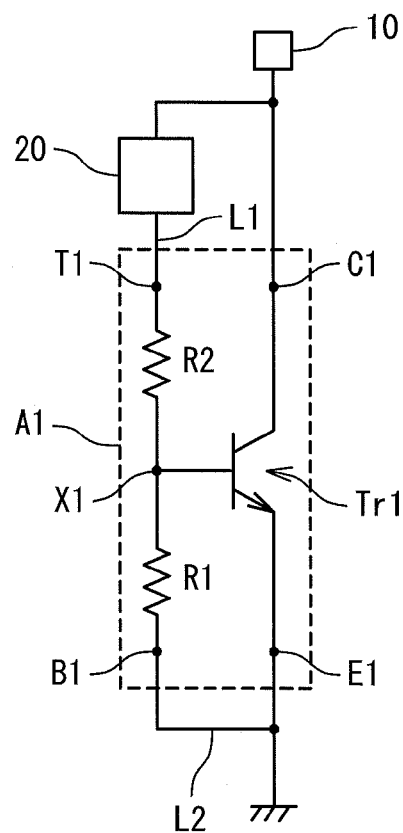
FIG. 7 is a diagram illustrating another example of the equivalent circuit of the ESD protection element in the first embodiment.
Figure 8:
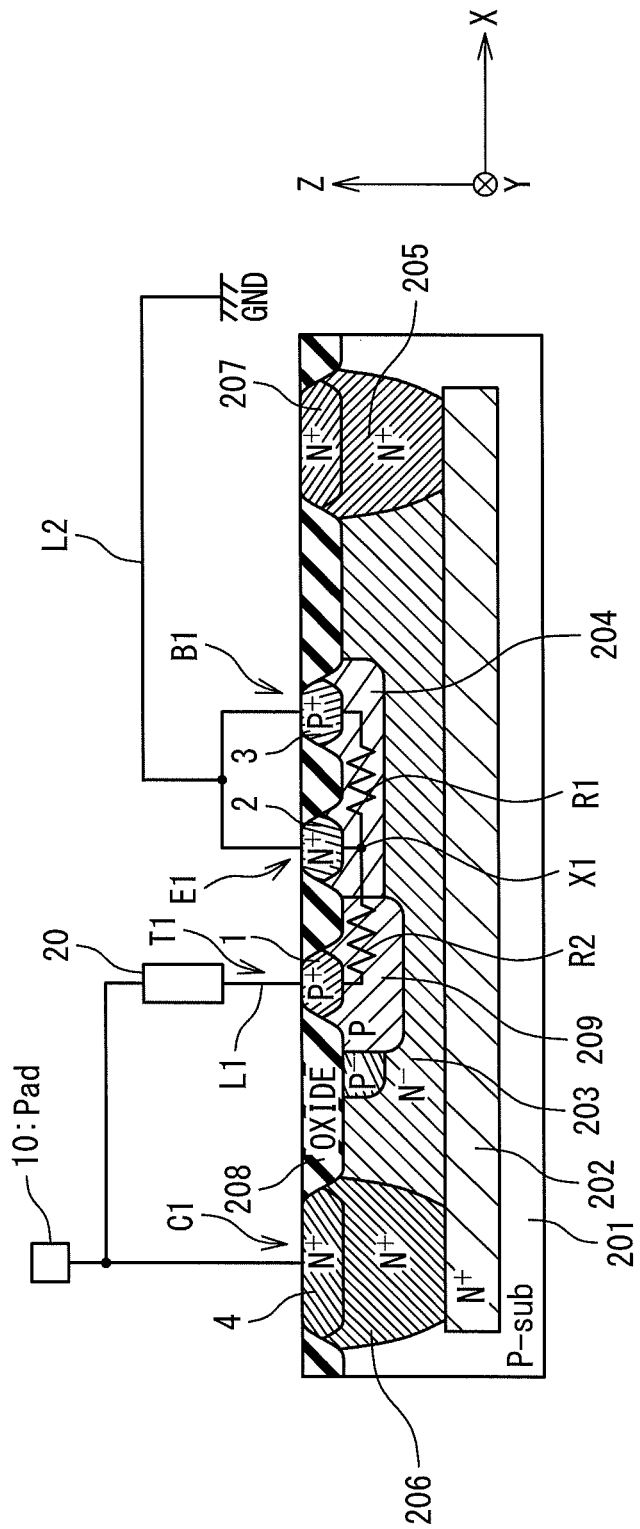
FIG. 8 is a cross-sectional view illustrating another example of the structure of the ESD protection element in the first embodiment.

Next, referring to FIGS. 7 and 8, a modification of the ESD protection element in the first embodiment will be described.

Although not illustrated in FIG. 4, a resistance due to the P⁻ base diffusion layer 204 is formed between the trigger tap T1 and the base region X1. That is, as in an equivalent circuit illustrated in FIG. 7, a resistance R2 due to the P⁻ base diffusion layer 204 is formed between the trigger tap T1 and the base region X1. When the trigger current flows, a voltage of the trigger tap T1 is increased for a voltage drop by the resistance R2. For this reason, in order to flow the trigger current through the resistance R1, a higher voltage than that a voltage the resistance R2 is not present should be applied to the pad 10.

In order for the ESD protection element to operate in a lower ESD voltage, the resistance value of the resistance R2 should be decreased. For example, as illustrated in FIG. 8, an impurity concentration of a base diffusion layer (P-type heavily doped diffusion layer) 209 between the trigger tap T1 and the base region X1 is made higher than that of the peripheral P⁻ base diffusion layer 204, and the resistance value of the resistance R2 can be decreased. For example, the P-type heavily doped diffusion layer 209 can be formed by further doping impurity into the P⁻ base diffusion layer 204. Alternatively, by decreasing the distance between the trigger tap T1 and the base region X1, or increasing areas of opposing portions of the trigger tap diffusion layer 1 and the N⁺ emitter diffusion layer 2, the resistance value of the resistance R2 can be decreased.

The ESD protection element is a high breakdown voltage element, and therefore even if a voltage applied to the pad 10 is approximately a few to ten times higher than a breakdown voltage (a forward drop voltage of an NP junction) of the NPN bipolar transistor Tr1, damage to internal elements is unlikely to increase. However, the ESD voltage serving as a trigger for the bipolar operation may be desired to be decreased. In such a case, by setting the resistance value of the resistance R2 lower as described above, an operation voltage of the ESD protection element can be decreased.

[Second Embodiment]

Figure 9:
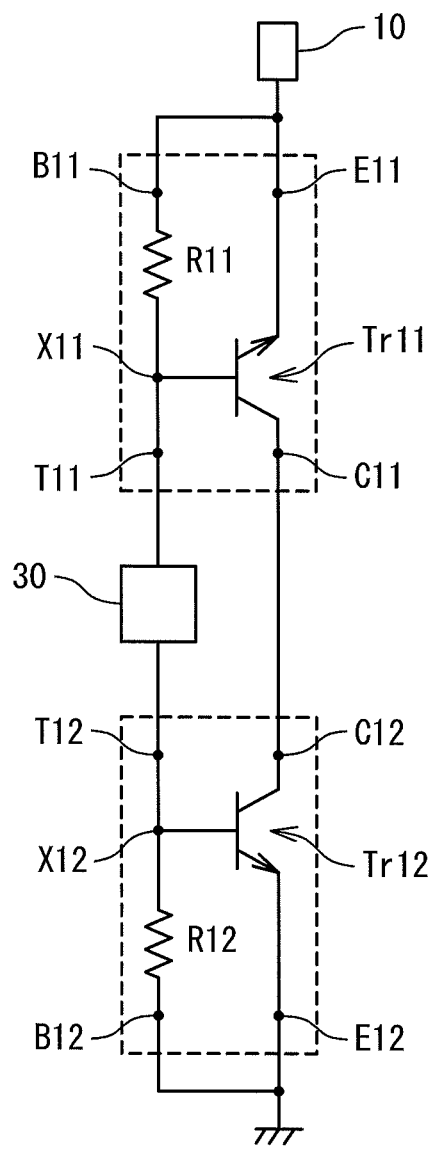
FIG. 9 is a diagram illustrating an example of an equivalent circuit of the ESD protection element according to a second embodiment of the present invention.
Figure 10:
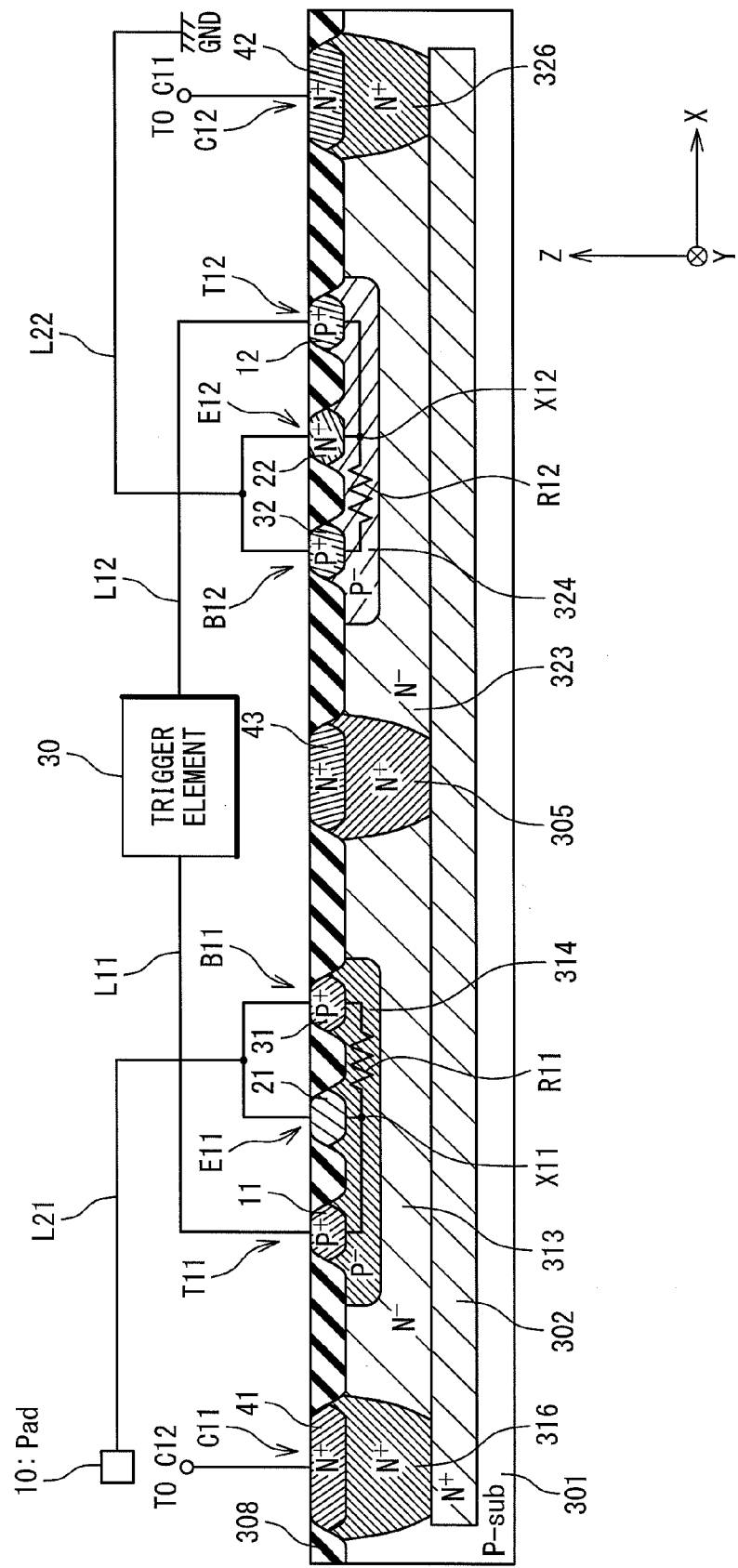
FIG. 10 is a cross-sectional view illustrating an example of a structure of the ESD protection element in the second embodiment.

Referring to FIGS. 9 to 14, a configuration and operation of the ESD protection element according to a second embodiment of the present invention will be described. In the first embodiment, the ESD protection element was described that, when a positive high voltage is applied to the pad, the surge current flows to the power supply line (GND) to protect the internal circuit. In the second embodiment, an ESD protection circuit will be described that, even if not only a positive voltage but a negative high voltage is applied to a pad, flows surge current to a power supply line (GND) to protect an internal circuit. FIG. 9 is a diagram illustrating an equivalent circuit of the ESD protection element according to the second embodiment of the present invention. FIG. 10 is a cross-sectional view illustrating a structure of the ESD protection element according to the second embodiment of the present invention.

Referring to FIG. 9, the ESD protection element in the second embodiment is provided with an NPN bipolar transistor Tr1 connected to the pad 10, an NPN bipolar transistor Tr2 connected to the power supply line (GND), and a trigger element 30.

An emitter terminal E11 of the NPN bipolar transistor Tr11 is connected to the pad 10; a base region X11 thereof is connected to the trigger element 30 and a resistance R11, and a collector terminal C11 is connected to a collector terminal C12 of the NPN bipolar transistor Tr12. The base region X11 of the NPN bipolar transistor Tr11 and one terminal of the trigger element 30 are connected to each other through a trigger tap T11 and a wiring line L11. The resistance R11 is formed between the base region X11 and the base terminal B11, and connected to the pad 10 through the base terminal B11 and a wiring line L21.

An emitter terminal E12 of the NPN bipolar transistor Tr12 is connected to the power supply line (GND), a base region X12 thereof is connected to the trigger element 30 and a resistance R12, and the collector terminal C12 thereof is connected to the collector terminal C11 of the NPN bipolar transistor Tr11. The base region X12 of the NPN bipolar transistor Tr12 and the other terminal of the trigger element 30 are connected to each other through a trigger tap T12 and the wiring line L12. The resistance R12 is formed between the base region X12 and the base terminal B12, and connected to the power supply line (GND) through the base terminal B12 and a wiring line L22.

A region A2 surrounded by a dashed line in FIG. 9 represents a region that is formed in a base layer below a wiring layer in a region where the NPN bipolar transistor Tr11 or Tr12 is formed. Referring to FIG. 10, the configurations of the NPN bipolar transistor Tr11 or Tr12 and the resistance R11 or R12 formed in the region A2 are described in detail.

Referring to FIG. 10, in the ESD protection element in the second embodiment, a heavily doped N-type diffusion layer (N⁺ diffusion layer) 302 is formed on a P-type substrate 301 (P-sub). Heavily doped N-type diffusion layers (N⁺ diffusion layers) 305, 316, and 326, and lightly doped N-type diffusion layers (N⁻ diffusion layers) 313 and 323 are formed on the N⁺ diffusion layer 302. The N-diffusion layer 313 is formed between the N⁺ diffusion layers 305 and 316, and a lightly doped P-type diffusion layer (hereinafter to be referred to as a P⁻ base diffusion layer) 314 is formed to function as a base region. The N⁻ diffusion layer 323 is formed between the N⁺ diffusion layers 305 and 326, and a lightly doped P-type diffusion layer (hereinafter to be referred to as a P⁻ base diffusion layer) 324 is formed to function as a base region.

A heavily doped P-type diffusion layer (hereinafter to be referred to as a trigger tap diffusion layer) 11, a heavily doped N-type diffusion layer (hereinafter to be referred to as an N⁺ emitter diffusion layer) 21, and a heavily doped P-type diffusion layer (hereinafter to be referred to as a P⁺ base diffusion layer) 31 are formed on the P⁻ base diffusion layer 314. The trigger tap diffusion layer 11 is connected to the one terminal of the trigger element 30 through the wiring line L11, to function as a trigger tap T11 that connects the trigger element 30 and the P⁻ base diffusion layer 314. The N⁺ emitter diffusion layer 21 is connected to the pad 10 through the wiring line L21 that is different from the wiring line L11, and functions as an emitter terminal E11. The P⁺ base diffusion layer 31 is connected to the pad 10 through the wiring line L21, and functions as a base terminal B11. The wiring lines L11 and L21 are electrically isolated from each other in the wiring layer. Also, a heavily doped N-type diffusion layer (hereinafter to be referred to as an N⁺ collector diffusion layer) 41 is formed on the N⁺ diffusion layer 316 to function as the collector terminal C11 connected to the N⁺ diffusion layer 326. Further, a heavily doped N-type diffusion layer 43 is provided on the N⁺ collector diffusion layer 305.

The N⁺ emitter diffusion layer 21 is preferably formed between the trigger tap diffusion layer 11 and the P⁺ base diffusion layer 31 in an X-axis direction. It should be noted that a region just below the N⁺ emitter diffusion layer 21 in the P⁻ base diffusion layer 314 is configured as a base region X11. When the N⁺ emitter diffusion layer 21 is provided between the trigger tap diffusion layer 11 and the P⁺ base diffusion layer 31, a trigger current flows from the trigger tap T11 to the pad 10 through the base region X11 and the base terminal B11. In such a case, a region between the base terminal B11 and the base region X11 in the P⁻ base diffusion layer 314 functions as a resistance R11, and pulls up a voltage (base voltage) of the base region X11 with the trigger current flowing from the power supply line (GND) to the pad 10.

A heavily doped P-type diffusion layer (hereinafter to be referred to as a trigger tap diffusion layer) 12, a heavily doped N-type diffusion layer (hereinafter to be referred to as an N⁺ emitter diffusion layer) 22, and a heavily doped P-type diffusion layer (hereinafter to be referred to as a P⁺ base diffusion layer) 32 are formed on the P⁻ base diffusion layer 324. The trigger tap diffusion layer 12 is connected to the other terminal of the trigger element 30 through the wiring line L12, to function as a trigger tap T12 that connects the trigger element 30 and the P⁻ base diffusion layer 324. The N⁺ emitter diffusion layer 22 is connected to the power supply line (GND in this case) through a wiring line L22 that is different from the wiring line L12, and functions as an emitter terminal E12. The P⁺ base diffusion layer 32 is connected to the power supply line (GND in this case) through the wiring line L22, and functions as a base terminal B12. Also, a heavily doped N-type diffusion layer (hereinafter to be referred to as an N⁺ collector diffusion layer) 42 is formed on the N⁺ diffusion layer 326 to function as a collector terminal C12 connected to the N⁺ diffusion layer 316.

The N⁺ emitter diffusion layer 22 is preferably formed between the trigger tap diffusion layer 12 and the P⁺ base diffusion layer 32 in the X-axis direction. It should be noted that a region just below the N⁺ emitter diffusion layer 22 in the P⁻ base diffusion layer 324 is configured as a base region X12. When the N⁺ emitter diffusion layer 22 is provided between the trigger tap diffusion layer 12 and the P⁺ base diffusion layer 32, a trigger current flowing from the trigger tap T12 to the power supply line (GND) flows through the base region X12 and the base terminal B12. In the P⁻ base diffusion layer 324, a region between the base terminal B12 and the base region X12 functions as a resistance R12, and pulls up a voltage (base voltage) of the base region X12 with the trigger current flowing from the pad 10 to the power supply line (GND).

It should be noted that any adjacent two of the N⁺ collector diffusion layer 41, the trigger tap diffusion layer 11, the N⁺ emitter diffusion layer 21, the P⁺ base diffusion layer 31, the heavily doped N-type diffusion layer 43, the P⁺ base diffusion layer 32, the N⁺ emitter diffusion layer 22, the trigger tap diffusion layer 12, and the N⁺ collector diffusion layer 42 are isolated from each other by an element isolation region 308 (e.g., an oxide insulating film).

Figure 11:
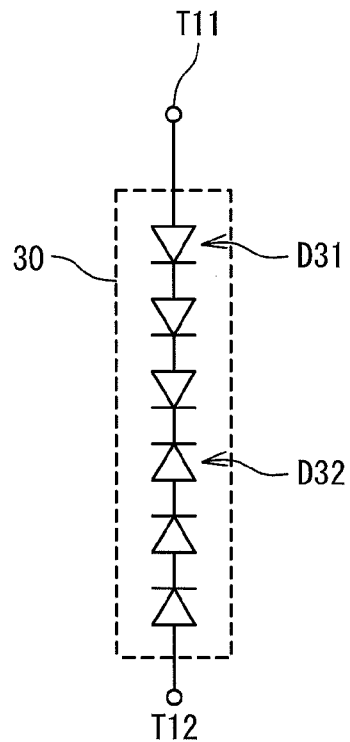
FIG. 11 is a circuit diagram illustrating an example of a configuration of a trigger element in the second embodiment.

As the trigger element 30, diodes or a transistor (MOS transistor or NPN bipolar transistor) can be preferably used as in the conventional technique. For example, referring to FIG. 11, a circuit element in which an arbitrary number of diodes D31 and D32 are connected in series can be used as the trigger element 30. In this case, cathodes of the diodes D31 and D32 are connected to each other as shown in FIG. 11, an anode of the diode D31 is connected to the trigger tap T11, and an anode of the diode D32 is connected to the trigger tap T12. If a positive voltage equal to or more than a breakdown voltage of the diodes D31 is applied to the pad 10, the trigger current flows from the pad 10 to the power supply line (GND) through the base region X12 and the resistance R12. Thus, the voltage of the base region X12 increases to operate the NPN transistor Tr12, and thereby the surge current starts to flow from the pad 10 to the power supply line (GND). Alternatively, if a negative voltage equal to or more than a breakdown voltage of the diodes D32 is applied to the pad 10, the trigger current flows from the power supply line (GND) to the pad 10 through the base region X11 and resistance R11. Thus, the voltage of the base region X11 increases to operate the NPN transistor Tr11, and thereby the surge current starts to flow from the power supply line (GND) to the pad 10.

Figure 12:
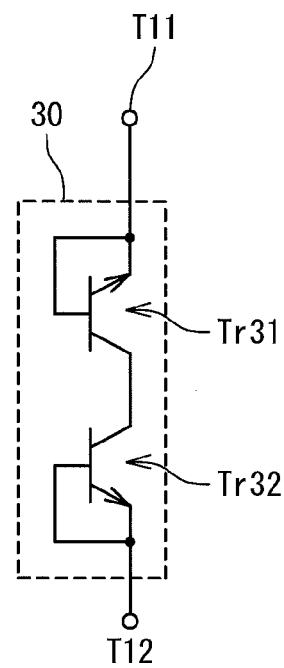
FIG. 12 is a circuit diagram illustrating another example of the configuration of a trigger element in the second embodiment.

Further, referring to FIG. 12, transistors Tr31 and Tr32 can be used as the trigger element 30. For example, the trigger element 30 is provided with the transistors Tr31 and Tr32 of which collectors are connected to each other. A base and an emitter of the transistor Tr31 are connected to the trigger tap T11, and a base and an emitter of the transistor Tr32 are connected to the trigger tap T12. When a positive voltage is applied to the pad 10, the transistor Tr31 functions as a diode, and a collector voltage of the transistor Tr32 increases. At this time, if a positive voltage equal to or more than a predetermined value is applied to the pad 10, the transistor Tr32 is broken down, and the trigger current flows to the power supply line (GND) through the base region X1 and the resistance R1. Alternatively, when a negative voltage is applied to the pad 10, the transistor Tr32 functions as a diode, and a collector voltage of the transistor Tr31 increases. At this time, if a negative voltage equal to or more than a predetermined value is applied to the pad 10, the transistor Tr31 is broken down, and the trigger current flows to the pad 10 through the base region X1 and the resistance R1.

Next, the operation of the ESD protection element in the second embodiment will be described in detail.

If a positive ESD voltage equal to or more than a predetermined voltage is applied to the pad 10, the trigger element 30 (e.g., of the diodes D32) is broken down. This causes the trigger current to flow from the trigger tap T12 to the power supply line (GND) through the base region X12. The trigger current causes a voltage drop due to the resistance R12 to pull up the voltage (base voltage) of the base region X12. At this time, the NPN transistor Tr11 functions as a forward bias diode because a diode formed between the base and the collector is brought into a forward bias state.

The increase in the base voltage brings a voltage of a PN junction between the emitter terminal E12 and the base region X12 into a forward bias state, and therefore electron current starts to flow from the emitter terminal E12 to the base region X12. The electron current reaches the collector terminal C12 through diffusion to form a collector current. At this time, a depletion layer having a high electric field is formed between the collector terminal C12 and the base region X12 (between the N⁻ diffusion layer 313 and the P⁻ base diffusion layer 314). In this region, the electron current causes impact ionization to generate a base current. The base current produces forward biasing between the emitter terminal E12 and the base region X12, and the NPN bipolar transistor Tr12 is brought into an ON state to start a snap back operation. Thus, the surge current (ESD current) due to ESD starts to flow from the pad 10 to the power supply line (GND) through the collector terminal C12 and the emitter terminal E12. When the current starts to flow through the NPN bipolar transistor Tr12, the base voltage decreases and reaches a constant voltage, and therefore the trigger current through the trigger element 30 stops flowing.

As described above, if a positive high voltage due to ESD is applied to the pad, the ESD protection element in the present embodiment starts the bipolar operation because of the breakdown of the trigger element 30, and the surge current flows from the pad 10 toward the power supply line (GND). This allows the internal circuit to be protected from the ESD.

If a negative ESD voltage equal to ore more than the predetermined voltage is applied to the pad 10, the trigger element 30 (e.g., of the diodes D31) is broken down. This causes the trigger current to flow from the trigger tap T11 to the pad 10 through the base region X11. The trigger current causes a voltage drop due to the resistance R11 to pull up the voltage (base voltage) of the base region X11. At this time, the NPN transistor Tr12 functions as a forward biased diode because a diode formed between the base and the collector is brought into a forward bias state.

The increase in the base voltage brings a voltage of the PN junction between the emitter terminal E11 and the base region X11 into a forward bias state, and therefore an electron current starts to flow from the emitter terminal E11 to the base region X11. The electron current reaches the collector terminal C11 through diffusion to form the collector current. At this time, a depletion layer having a high electric field is formed between the collector terminal C11 and the base region X11 (between the N$^-$ diffusion layer 323 and the P$^-$ base diffusion layer 324). In this region, the electron current causes impact ionization to generate a base current. The base current causes forward biasing between the emitter terminal E11 and the base region X11, and the NPN bipolar transistor Tr11 is brought into an ON state to start the snap back operation. Thus, the surge current (ESD current) due to ESD starts to flow from the power supply line (GND) to the pad 10 through the collector terminal C11 and the emitter terminal E11. When the current starts to flow through the NPN bipolar transistor Tr11, the base voltage decreases and reaches a constant voltage, and therefore the trigger current through the trigger element 30 stops flowing.

As described above, if a negative high voltage due to ESD is applied to the pad, the ESD protection element in the present embodiment starts the bipolar operation because of the breakdown of the trigger element 30, and the surge current flows between the pad 10 and the power supply line (GND). This allows the internal circuit to be protected from the ESD.

According to the ESD protection element in the second embodiment, the trigger element functions as a trigger for the bipolar operation in the same manner as in the conventional case. For this reason, a reduction in ESD endurance due to a variation in current density in the base width direction (Y-axis direction) can be avoided.

Also, in the ESD protection element in the second embodiment, as in the first embodiment, the base terminals B11 and B12 respectively connected to the pad 10 and the power supply line (GND), and the trigger taps T11 and T12 connected to the trigger element 30 are separately provided on the P$^-$ base diffusion layer 314 or 324 serving as the base region. By forming the emitter terminal E11 (base region X11) between the trigger tap T11 and the base terminal B11, the P$^-$ base diffusion layer 314 between the base region X11 and the base terminal B11 functions as the resistance R11 for pulling up the base voltage. Similarly, by forming the emitter terminal E12 (base region X12) between the trigger tap T12 and the base terminal B12, the P$^-$ base diffusion layer 324 between the base region X12 and the base terminal B12 functions as the resistance R12 for pulling up the base voltage. For this reason, by setting a distance between the base region X11 (X12) and the base terminal B11 (B12), and impurity concentrations of the P$^-$ base diffusion layers 314 and 324 to appropriate values, values of the resistance R11 and R12 can be arbitrarily set. That is, the resistances R11 and R12 having the values determined by taking into account noise endurance can be realized by the base diffusion layers.

The P$^-$ base diffusion layer 314 (324) is connected through the base terminal B11 (B12) to the pad 10 (power supply line (GND)) common to the emitter terminal (N$^+$ emitter diffusion layer 21 (22)), and a resistance value of the resistance R11 (R12) can be set smaller than that of a conventional external resistance. For this reason, a voltage difference between the emitter terminal E11 (E12) and the base region X11 (X12) can be set smaller than that in the conventional case, to improve the noise endurance of the ESD protection element. Also, in the present invention, an external resistance is not used, and therefore the number of elements used for the ESD protection element, and a wiring amount can be reduced.

Figure 13:
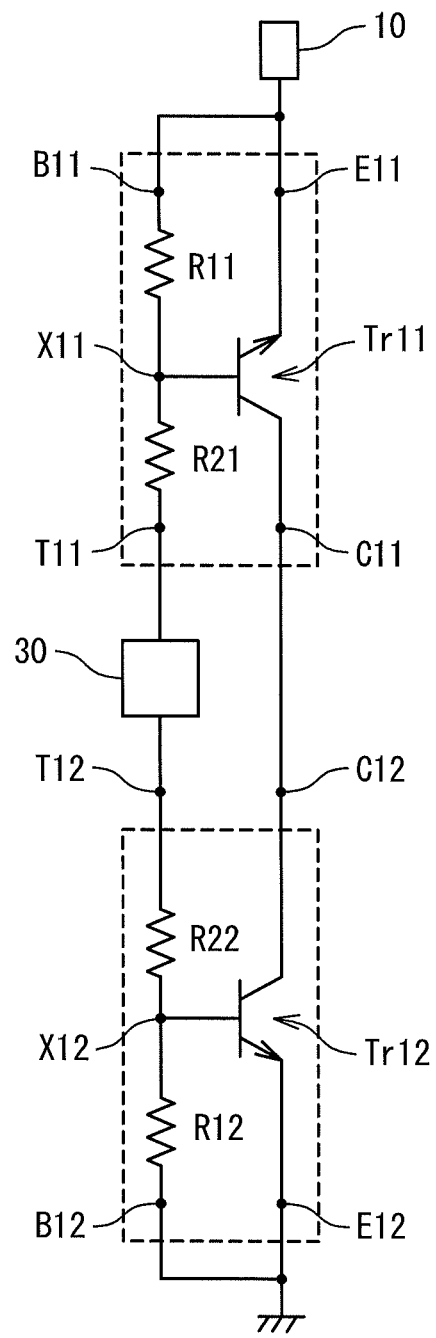
FIG. 13 is a diagram illustrating another example of the equivalent circuit of the ESD protection element in the second embodiment.
Figure 14:
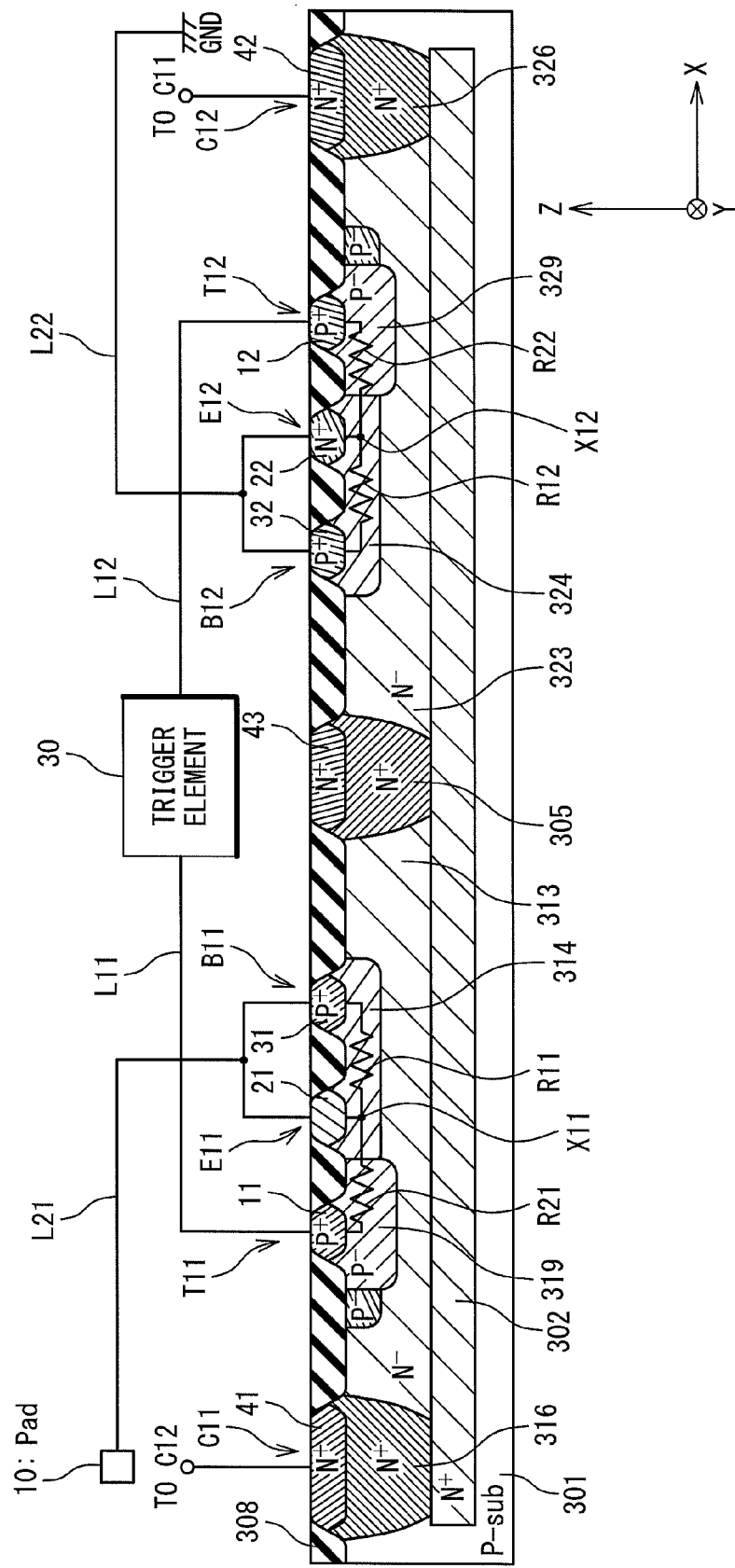
FIG. 14 is a cross-sectional view illustrating another example of the structure of the ESD protection element in the second embodiment.

Next, referring to FIGS. 13 and 14, a variation of the ESD protection element in the second embodiment will be described.

Although not illustrated in FIG. 9, a resistance due to the P$^-$ base diffusion layer 314 is formed between the trigger tap T11 and the base region X11. Similarly, a resistance due to the P$^-$ base diffusion layer 324 is formed between the trigger tap T12 and the base region X12. That is, as in an equivalent circuit illustrated in FIG. 13, the resistance R21 due to the P$^-$ base diffusion layer 314 is formed between the trigger tap T11 and the base region X11, and the resistance R22 due to the P$^-$ base diffusion layer 324 is formed between the trigger tap T12 and the base region X12. When the trigger current flows from the power supply line (GND), a voltage of the trigger tap T11 is increased by a voltage drop by the resistance R21. For this reason, in order for the trigger current to flow through the resistance R11, a lower voltage than a voltage when the resistance R21 is not present should be applied to the pad 10. Similarly, when the trigger current flows from the pad 10, a voltage of the trigger tap T12 is increased by a voltage drop by the resistance R22. For this reason, in order for the trigger current to flow through the resistance R12, a higher voltage than a voltage when the resistance R22 is not present should be applied to the pad 10.

In order for the ESD protection element to operate with a negative high ESD voltage or positive low ESD voltage, resistance values of the resistances R21 and R22 should be decreased. For example, as illustrated in FIG. 14, an impurity concentration of a base diffusion layer (P-type heavily doped diffusion layer) 319 between the trigger tap T11 and the base region X11 is made higher than that of the peripheral P$^-$ base diffusion layer 314, and thereby the resistance value of the resistance R21 can be decreased. Similarly, an impurity concentration of a base diffusion layer (P-type heavily doped diffusion layer) 329 between the trigger tap T12 and the base region X12 is made higher than that of the peripheral P$^-$ base diffusion layer 324, and thereby the resistance value of the resistance R22 can be decreased. Alternatively, by decreasing the distance between the trigger tap T11 (T12) and the base region X11 (X12), or increasing areas of opposing portions of the trigger tap diffusion layer 11 (12) and the N$^-$ emitter diffusion layer 21 (22), the resistance value of the resistance R21 (R22) can be decreased.

According to the ESD protection element in the present embodiment, when the ESD voltage serving as the trigger for the bipolar operation is desired to be decreased, an operation voltage of the ESD protection element can be decreased by setting the resistance values of the resistances R21 and R22 lower.

[Third Embodiment]

Figure 15:
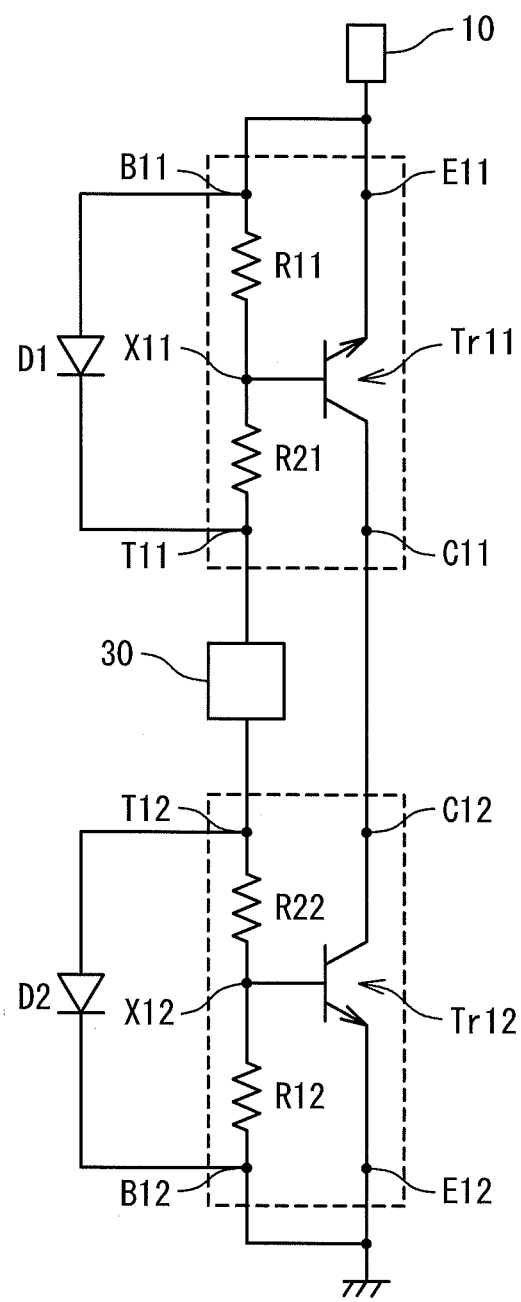
FIG. 15 is a diagram illustrating an example of an equivalent circuit of the ESD protection element according to a third embodiment of the present invention.

Referring to FIG. 15, a configuration and operation of the ESD protection element according to a third embodiment of the present invention will be described. FIG. 15 is a diagram illustrating an equivalent circuit of the ESD protection element according to the third embodiment of the present invention. Referring to FIG. 15, an ESD protection element in the third embodiment has a configuration in which diodes D1 and D2 are added to the ESD protection element in the second embodiment. Internal structures of the NPN bipolar transistors Tr11 and Tr12, and the resistances R11, R12, R21, and R22 are the same as those in the modification of the second embodiment illustrated in FIG. 14, and therefore description thereof is omitted.

Referring to FIG. 15, if a positive ESD voltage is applied to the pad 10, the trigger element 30 is broken down, and the trigger current flows in the order from the pad 10, to the resistance R11, the resistance R21, the trigger element 30, the resistance R22, the resistance R12, and the power supply line (GND). If the trigger current is increased, a voltage at the trigger tap T11 is increased due to the voltage drop due to the resistance R21, and exceeds a forward drop voltage Vf of a diode formed between the trigger tap T11 (trigger tap diffusion layer 11) and the emitter terminal E11 (N$^+$ emitter diffusion layer 21). Thus, a current path of the trigger current is changed to a path having the order from the pad 10, to the diode D1, the trigger element 30, the resistive element R22, the resistance R12, and the power supply line (GND). That is, if the trigger current is increased, the trigger current flows through the diode D1 instead of the resistances R11 and R21.

When the trigger current flows through the resistances R11 and R21, the value of the trigger current is limited due to the voltage drop. In such a case, an increase in voltage of the base region X12 is made small, so that a time necessary to start a bipolar operation may be increased, or the ESD voltage necessary to flow a surge current to GND may be increased. In the present embodiment, if the trigger current is increased, the trigger current flows without passing through the resistances R11 and R21, and therefore a current amount of the trigger current flowing through the resistance R12 can be increased. For this reason, even in the case of a small positive ESD voltage, the trigger current necessary for the NPN bipolar transistor Tr12 to operate can be flowed through the resistance R12.

Similarly, when a negative ESD voltage is applied to the pad 10, if the trigger current is increased, the trigger current flows through the diode D2 without flowing through the resistances R12 and R22. Thus, even in the case of a small negative ESD voltage, the trigger current necessary for the NPN bipolar transistor Tr11 to operate can be flowed through the resistance R11.

In the above, the embodiments of the present invention have been described in detail. However, a specific configuration is not limited to any of the above-described embodiments, but any modification without departing from the scope of the present invention is included in the present invention. The first to third embodiments may be combined unless technical contradiction occurs. For example, the power supply line may be set to another voltage different from the ground voltage.

What is claimed is:

1. An electrostatic discharge (ESD) protection element using an NPN bipolar transistor, comprising:
    a trigger element connected at one end with a pad,
    wherein said NPN bipolar transistor comprises:
        a first base diffusion layer;
        a collector diffusion layer connected with said pad;
        a trigger tap formed on said first base diffusion layer and connected with the other end of said trigger element through a first wiring; and
        an emitter diffusion layer and a second base diffusion layer each separately connected at a common junction provided at a second wiring directly connecting each of the emitter diffusion layer and the second base diffusion layer to the power supply,
    wherein the emitter diffusion layer and the second base diffusion layer are formed on said first base diffusion layer, and the second wiring at which the emitter diffusion layer and the second base diffusion layer are connected is different from said first wiring.

2. The ESD protection element according to claim 1, wherein said emitter diffusion layer is formed between said trigger tap and said second base diffusion layer.

3. An electrostatic discharge (ESD) protection element, comprising:
    a trigger element connected at one end with a pad; and
    an NPN bipolar transistor comprising
        a first base diffusion layer,
        a collector diffusion layer connected with said pad,
        a trigger tap formed on said first base diffusion layer and connected with the other end of said trigger element through a first wiring, and
        an emitter diffusion layer and a second base diffusion layer formed on said first base diffusion layer and connected in common to a power supply through a second wiring which is different from said first wiring, the emitter diffusion layer being formed between the trigger tap and the second base diffusion layer,
    wherein an impurity concentration of said first base diffusion layer between said trigger tap and said emitter diffusion layer is higher than that of said first base diffusion layer between said second base diffusion layer and said emitter diffusion layer.

4. The ESD protection element according to claim 1, wherein said trigger element comprises at least one diode.

5. The ESD protection element according to claim 1, wherein said trigger element comprises a transistor having a source and a drain connected between said NPN bipolar transistor and said pad.

6. An electrostatic discharge (ESD) protection element comprising first and second NPN bipolar transistors whose collectors are connected to each other, and a trigger element,
    wherein said first NPN bipolar transistor comprises:
        a first base diffusion layer;
        a first trigger tap formed on said first base diffusion layer and connected with one end of said trigger element through a first wiring; and
        a first emitter diffusion layer and a second base diffusion layer formed on said first base diffusion layer and connected in common to said pad through a second wiring which is different from said first wiring, and
    wherein said second NPN bipolar transistor comprises:
        a third base diffusion layer;
        a second trigger tap formed on said third base diffusion layer and connected with the other end of said trigger element through a third wiring; and
        a second emitter diffusion layer and a fourth base diffusion layer formed on said third base diffusion layer and connected in common to a power supply through a fourth wiring which is different from said third wiring.

7. The ESD protection element according to claim 6, wherein said first emitter diffusion layer is formed between said first trigger tap and said second base diffusion layer, and
    wherein said second emitter diffusion layer is formed between said second trigger tap and said fourth base diffusion layer.

8. The ESD protection element according to claim 7, wherein an impurity concentration of said first base diffusion layer between said first trigger tap and said first emitter diffusion layer is higher than that of said first base diffusion layer between said second base diffusion layer and said first emitter diffusion layer, and
    wherein an impurity concentration of said third base diffusion layer between said second trigger tap and said second emitter diffusion layer is higher than that of said third base diffusion layer between said fourth base diffusion layer and said second emitter diffusion layer.

9. The ESD protection element according to claim 8, further comprising:
- a first diode connected between said pad and said one end of said trigger element; and
- a second diode connected between said power supply and said other end of said trigger element.

10. The ESD protection element according to claim 6, wherein said trigger element comprises at least one diode.

11. The ESD protection element according to claim 6, wherein said trigger element comprises a transistor having a source and a drain connected between said NPN bipolar transistor and said pad.

12. The ESD protection element according to claim 1, wherein the first wiring and the second wiring including the common junction of the emitter diffusion layer and the second base diffusion layer are electrically isolated from each other in a wiring layer.

13. The ESD protection element according to claim 1, wherein when a voltage higher than a predetermined voltage is applied to the pad, trigger current flows from the trigger tap into the first base diffusion layer and subsequently flows from the first base diffusion layer to the power supply through the second base diffusion layer.

14. The ESD protection element according to claim 1, wherein the first wiring and the second wiring including the junction of the emitter diffusion layer and the second base diffusion layer are disposed in a wiring layer, the NPN transistor being disposed in a region below the wiring layer.

15. The ESD protection element according to claim 1, wherein the emitter diffusion layer and the second base diffusion layer are each disposed directly on the first base diffusion layer.

16. The ESD protection element according to claim 1, wherein a resistance formed in the first base diffusion layer between a base region of the first base diffusion layer and the second base diffusion layer is connected to the power supply through the second base diffusion layer and the second wiring line.

17. The ESD protection element according to claim 16, wherein the resistance pulls up a voltage of the base region with trigger current flowing from the trigger tap into the first base diffusion layer.

* * * * *